United States Patent [19]

Herbert et al.

US005352329A

[11] Patent Number: 5,352,329
[45] Date of Patent: Oct. 4, 1994

[54] REMOVING PORTIONS OF IMAGING MEMBER LAYERS FROM A SUBSTRATE

[75] Inventors: William G. Herbert, Williamson; Gary J. Maier; Ernest F. Matyi, both of Webster; Monroe J. Hordon, Pittsford, all of N.Y.

[73] Assignee: Xerox Corporation, Stamford, Conn.

[21] Appl. No.: 163,777

[22] Filed: Dec. 9, 1993

[51] Int. Cl.⁵ ............................................. B44C 1/22
[52] U.S. Cl. .................................. 156/646; 156/655; 156/656; 134/3
[58] Field of Search ............... 156/639, 640, 646, 655, 156/656, 659.1, 668; 134/2, 3, 31; 252/79.1, 79.4, 143; 430/329

[56] References Cited

U.S. PATENT DOCUMENTS

| | | | |
|---|---|---|---|
| 3,460,296 | 8/1969 | Dittmar | 51/320 |
| 3,773,579 | 11/1973 | Michelson et al. | 148/6.27 |
| 4,169,068 | 9/1979 | Harita et al. | 252/143 |
| 4,501,621 | 2/1985 | Abe et al. | 134/17 |
| 5,085,732 | 2/1992 | Nakamura et al. | 156/656 |
| 5,110,494 | 5/1992 | Beck | 252/156 |
| 5,170,683 | 12/1992 | Kawada et al. | 82/1.11 |
| 5,185,235 | 2/1993 | Sato et al. | 134/42 X |
| 5,207,858 | 5/1993 | Googin et al. | 134/42 |
| 5,215,675 | 6/1993 | Wilkins et al. | 252/100 |
| 5,266,121 | 11/1993 | Cioletti | 134/3 |

*Primary Examiner*—William Powell
*Attorney, Agent, or Firm*—Oliff & Berridge

[57] ABSTRACT

Acetic acid, an environmentally compatible solvent, is used in a method for removing excess coating material from an electrostatographic imaging member substrate. The method involves covering the substrate so that the excess coating material remains exposed, and then contacting acetic acid on at least part of a substrate containing the excess coating layer until the excess coating material is removed from at least part of the substrate.

13 Claims, No Drawings

REMOVING PORTIONS OF IMAGING MEMBER LAYERS FROM A SUBSTRATE

This invention relates to electrostatography and, in particular, to a method for the selective and chemical separation of coating materials from imaging member substrates.

BACKGROUND OF THE INVENTION

High speed electrostatographic copying machines use different types of image receptors. Photoreceptors usually comprise a substrate bearing at least one photoconductive coating layer. One such photoreceptor is the drum type. In the manufacture of drum type photoreceptors, at least one photoconductive layer is coated on a cylindrical substrate by any of a variety techniques, e.g. vacuum coating, dip coating, spray coating, spinner coating, bead coating, wire bar coating, blade coating, roller coating, and curtain coating. These coating techniques, however, are imprecise in that the photoconductor can be coated in areas where no coating is required or desired For instance, in dip coating methods, a drum substrate is vertically maintained on its axis and then successively dipped in a chemical bath containing an organic photoconductive coating material. The dipped substrate is vertically withdrawn from the bath at a speed that will give a desired thickness for the organic photoconductive coating layer. The process is sometimes repeated to obtain a substrate drum having a plurality of organic photoconductive coating layers. With each dipping, however, a bead of coating material can form at the bottom end of the drum substrate. Bead formation is undesirable because it interferes with components such as charging devices, developer housing, etc., that maintain their interface separation with the photoreceptor by contacting and riding on the end of the photoreceptor. Consequently, the bead of material must be removed from the bottom edge of the photoreceptor. Additionally, coating material may form on the inside of the drum, which interferes with the subsequent placement and gluing of flanges.

Conventionally, a bottom edge wipe method is used to remove the excess photoconductive coating material using environmentally harmful chlorinated solvents such as chlorobenzene, trichloroethane and trichloroethylene in an automated process. A bottom edge wipe method entails causing the bottom (about 1 cm) of the photoreceptor to come into contact with brushes or webs containing a solvent capable of removing the photoconductive coating material. The brushes or webs contact the inside and outside of the drum to remove the excess coating material. The brushes and/or the photoreceptor is/are rotated to remove the excess photoconductive coating. When several coatings are required, each coating is often removed from the bottom of the drum before the next coating is applied because different solvents are often required for each layer. Complex machinery must be activated and environmentally unsafe solvents (which must be eventually disposed of in an environmentally safe but expensive way) used for each layer. Moreover, one must endure defects such as edge gouges, splashes, incomplete wipes, etc. that result when such machinery malfunctions. As a result, bottom edge wipe methods are cumbersome, inefficient, often produce photoreceptors of unacceptable quality, and require routine maintenance of equipment. This further results in increased activity in the clean room and ultimately slows down the manufacturing process. Further, bottom edge wipe methods are not always successful, requiring an extra step of hand wiping with the same environmentally incompatible chlorinated solvents. According to the present invention, bottom edge wipe can be performed outside of the clean room, without the use of complex machinery and in fewer steps by removing all coating layers in one pass and without the use of environmentally incompatible or harmful solvents.

Various methods have been proposed for separating photoconductive coating layers from substrates. One such method is disclosed in U.S. Pat. No. 3,460,296, to C. A. Dittmar, wherein a hard coating material is removed from a relatively soft substrate by impacting the hard coating with plastic beads having a modulus of elasticity less than the modulus of elasticity of the relatively soft substrate. This method, however, necessarily destroys the photoconductive layer and occasionally damages the substrate.

Another method is disclosed in U.S. Pat. No. 4,501,621, to Abe et al., wherein a coating layer, such as a selenium coating layer, is removed from a substrate by producing cracks in the layer, introducing a volume expansive material into the cracks and then causing the volume expansive material to expand, thereby dislodging the coating layer from the substrate. This method, however, can undesirably destroy the photoconductive coating layer, as well as the metallic substrate sought to be used as a datum or point of reference for other devices found in electrostatographic copiers.

U.S. Pat. No. 5,085,732, to Nakamura et al., discloses a method for removing an amorphous selenium containing photoconductive layer from an electrostatographic photoreceptor by treating the photoreceptor with an aqueous solution of sodium sulfide or sodium thiourea. These chemicals require special treatment before disposal and will not remove many organic coatings.

Other methods include cutting the photoconductive coating layer from the metallic substrate; exfoliating the coating layer by repeated heating and cooling; exfoliating the coating layer by high pressure hot water ejected from a nozzle; heating the coating layer under vacuum to vaporize it; and heating the coating layer followed by chemical treatment. Each of these known methods, however, has residual problems. For example, some of the methods evolve dust or emit harmful vapors or poisonous substances. Some of these methods use environmentally incompatible solvents. And some of these methods involve heat and solvents which undesirably damage the photoconductive layer and the underlying substrate. Moreover, heating a photoreceptor may drive off other chemicals and produce hazardous fumes.

SUMMARY OF THE INVENTION

The present invention provides a method for removing portions of photoconductive coatings from imaging member substrates using environmentally compatible materials. The method may be carried out during the manufacturing process of a photoreceptor to remove excess coating material from a substrate. Concentrated or aqueous acetic acid is especially useful for removing excess coating materials from a substrate. Acetic acid is not hazardous to the environment, and thus can be safely disposed of by diluting and discharging into a sanitary sewer without special permits or procedures.

DETAILED DESCRIPTION OF PREFERRED EMBODIMENTS

Preferably, concentrated or aqueous acetic acid is used in a method comprising the steps of covering the substrate so that only the excess coating material to be removed is exposed; and then contacting acetic acid on the exposed coating material until the coating material is removed from the substrate.

According to the present invention, acetic acid may be applied to an imaging member as either a liquid, vapor, spray or any combination thereof. An applicator member, such as a buffing wheel, web or brush rotating against a substrate bearing a coating material, may be used to apply the acetic acid. The imaging member may also be dipped in a bath containing acetic acid.

Solutions of concentrated acetic acid or aqueous solutions of acetic acid may be used, preferably 50% acetic acid and 50% water, more preferably 75% acetic acid and 25% water, still more preferably 95% acetic acid and 5% water, and most preferably 100% acetic acid and 0% water.

The time required to remove the coating material is related to the temperature of the acetic acid and whether or not physical force is used. For instance, the higher the temperature, the less time is required to remove the coating material. Preferably, acetic acid removes a coating material from a substrate within about 1 to 30 min., more preferably, within about 1 to 3 min. Moreover, the acetic acid is preferably applied to a substrate bearing a coating material at room temperature or higher, more preferably between 21° to 117° C., and most preferably between 108° to 117° C.

The method of the present invention works with organic ionographic imaging members or organic photoreceptors. Examples of the materials to which the present method applies include, but are not limited to polycarbonate, triphenylamine, dibromoanthanthrone, vinylacetate-vinylchloride copolymer, nylons and organosilane compounds.

The invention will be further illustrated in the following, non-limiting examples. The examples are illustrative only and do not limit the claimed invention regarding the materials, conditions, process parameters and the like recited herein. Parts and percentages are by weight unless otherwise indicated.

EXAMPLE 1

A photoreceptor comprising a metallic drum substrate bearing a photoconductive coating material on the bottom inside and outside edge is fitted with a rubber membrane covering the photoreceptor from the top inside edge to about 1 cm from the bottom edge. Then, the photoreceptor is submerged by lowering it into a bath of 100% concentrated acetic acid at 108° C. for 2 minutes at a depth of 0.9 cm by holding it from the inside of the top or by using an automatic device. Fumes trapped between the rubber membrane and the surface of the hot acetic acid also cause the coating to be removed. A plug in the top of the photoreceptor is used to facilitate the positioning of the device during selective stripping and retards/restricts the migration of the acetic acid fumes up the inside of the drum. The drum with the membrane in place is then removed from the acetic acid. The residual acetic acid, which is contaminated with dissolved coating material, is removed by rinsing with clean 100% concentrated acetic acid followed by a deionized water rinse. The membrane is then removed by pulling the drum up through the membrane or moving the membrane toward and off of the bottom of the drum. Inspection of the drum substrate shows that all of the coating not covered by the rubber membrane is removed. Additionally, there is no apparent attack on the drum substrate or the noncontacted coating. The drum is left to stand at room temperature for four weeks with no apparent change in its appearance.

EXAMPLE 2

A photoreceptor comprising a metallic drum substrate bearing a photoconductive coating material on the bottom edge and inside of the substrate is fitted with a rubber membrane covering the photoreceptor to about 1 cm from the bottom edge. Then, the photoreceptor is submerged in concentrated acetic acid at 117° C. for 1.5 minutes at a depth of about 1 cm. The drum is then removed from the acetic acid, the remaining acetic acid rinsed off with acetic acid and then water at room temperature and the membrane removed. Inspection of the drum substrate shows that all of the coating not covered by the rubber membrane is removed. Additionally there is no apparent change in the drum substrate or the non-contacted coating.

Comparative Examples

Acetic acid and other solvents are tested to evaluate their effectiveness in removing photoconductive coating materials from metallic substrates without leaving any trace of the photoconductive coating material or solvent. In each of the tests, the substrates are rinsed at room temperature using either acetic acid, water or a combination thereof.

The solvents are placed in glass containers and heated to the reported temperatures. Once the solvents reach the desired temperatures, the process to remove photoconductive coating materials is started. Imaging members are dipped into the solvents with the use of a wire. After the reported time, the imaging members are removed from the solvent and the wire removed. Each imaging member is placed in a container. Each substrate is then either sprayed with acetic acid using a spray bottle, or dipped in a container of acetic acid to remove any remaining solvents. Then, each substrate is rinsed by dipping it in a container of deionized water or by spraying it with deionized water.

The results of the test are shown in Table 1 below.

TABLE 1

| SOLVENT(S) | CONCENTRATION (%) | TEMP. | TIME | RINSED @ ROOM TEMP. | RESULTS |
| --- | --- | --- | --- | --- | --- |
| Acetic Acid | 100 | 108° C. | 2 Min. | Acetic Acid/ then Water | Removed |
| Acetic Acid/ Dimethyl Malonate | 95/5 | 117° C. | 2 Min. | Acetic Acid/ then Water | Removed |
| Acetic Acid/Dimethyl Malonate | 97.5/2.5 | 113° C. | 2 Min. | Acetic Acid/ then Water | Removed |
| Water/Acetic Acid | 80/20 | 93° C. | 20 Min. | Water/Acetic | Removed |

TABLE 1-continued

| SOLVENT(S) | CONCENTRATION (%) | TEMP. | TIME | RINSED @ ROOM TEMP. | RESULTS |
|---|---|---|---|---|---|
| Dimethyl Malonate | 100 | 21° C. | 5 Min. | Acid Water | No Effect |
| Dimethyl Malonate | 100 | 21° C. | 3.5 Min. | Acetic Acid | Removed |
| Dimethyl Malonate | 100 | 88° C. | 2 Min. | Acetic Acid/ then Water | Removed |
| Water | 100 | 21° C. | >8 Hrs. | Water | Removed |
| Water | 100 | 93° C. | 30 Min. | Water | Removed |
| A-56*/Water | 20/80 | 93° C. | 15 Min. | Water | Removed |
| A-56/Water | 40/60 | 93° C. | 12 Min. | Water | Removed |
| A-56/Water | 20/80 | 21° C. | >8 Hrs. | Water | Removed |
| A-56/Water | 40/60 | 21° C. | 6 Hrs. | Water | Removed |
| Citric Acid | Saturated | 21° C. | >8 Hrs. | Water | No Effect |
| Citric Acid/Water | Saturated | 21° C. | >5 Hrs. | Water | No Effect |
| Citric Acid/Water | 40/60 | 93° C. | 30 Min. | Water | P/C Removed |
| Boric Acid/Water | Saturated | 21° C. | >8 Hrs. | Water | No Effect |
| Boric Acid/Water | Saturated | 93° C. | 4 Hrs. | Water | Removed |
| Boric Acid/Water | 40/60 | 93° C. | 4 Hrs. | Water | Removed |
| HCl** | 100 | 21° C. | <2 Min. | Water | No Effect |
| Nitric Acid** | 100 | 21° C. | 30 Min. | Water | No Effect |
| Sulfuric Acid** | 100 | 21° C. | <2 Min. | Water | No Effect |

*Manufactured by SPC Electronics ™
**The acid attacked or etched the substrate.

Table 1 shows that acetic acid alone removes coating layers within 2 minutes when heated to about 108° C. Table 1 also shows that neither hydrochloric acid, nitric acid nor sulfuric acid removes coating layers from substrates at 21° C. in less than 2 minutes (hydrochloric acid and sulfuric acid) or within 30 minutes (nitric acid), and that each undesirably etches the substrate. Citric acid mixed with water does not remove coating layers at 21° C. in 5 to 8 hours or more, but citric acid (40%) mixed with water (60%) and heated to 93° C. removes coating layers in 30 minutes. Moreover, water and mixtures of water and A-56 remove coating layers in from 12 minutes to 8 hours when rinsed with water. Finally, boric acid does not remove coating layers at 21° C., but does remove coating layers in 4 hours if heated to 93° C. and rinsed with water.

Thus, Table 1 shows that acetic acid more effectively, more quickly and/or at lower temperatures removes photoconductive coating layers from substrates than various comparative solvents, especially when acetic acid is used to rinse the substrate. The substrates are not etched by acetic acid.

While the invention has been described with reference to particular preferred embodiments and examples, the invention is not limited thereto and other embodiments and modifications can be made by those skilled in the art without departing from the spirit and scope of the invention and claims.

What is claimed is:

1. A method for removing a coating material from the edge of a photoreceptor substrate bearing the coating material, comprising:

(a) covering the substrate so that the coating material to be removed is exposed;
   (b) contacting solution comprising acetic acid to the exposed coating material until the coating material is removed from the substrate; and
   (c) rinsing the substrate with acetic acid and then water.

2. The method of claim 1, wherein a rubber membrane is used to cover the substrate in step (a).

3. The method of claim 1, wherein the solution of acetic acid comprises 100% acetic acid.

4. The method of claim 1, wherein the solution comprises about 95% acetic acid and about 5% water.

5. The method of claim 1, wherein the solution comprises about 75% acetic acid and about 25% water.

6. The method of claim 1, wherein the solution comprises about 50% acetic acid and about 50% water.

7. The method of claim 1, wherein in step (b) the solution is applied in the form of a spray.

8. The method of claim 1, wherein in step (b) the solution is applied in the form of a vapor.

9. The method of claim 1, wherein in step (b) the solution is applied in the form of a liquid.

10. The method of claim 1, wherein in step (b) the solution is impregnated in a buffing wheel.

11. The method of claim 1, wherein in step (b) the solution is first heated to about 108° C. to about 117° C.

12. The method of claim 7, wherein the solution is applied for about 2 minutes.

13. The method of claim 7, wherein the acetic acid in step (c) is aqueous acetic acid.

* * * * *